(12) United States Patent
Wang

(10) Patent No.: US 12,402,411 B2
(45) Date of Patent: Aug. 26, 2025

(54) DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventor: Hang Wang, Guangdong (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 445 days.

(21) Appl. No.: 18/149,069

(22) Filed: Dec. 30, 2022

(65) Prior Publication Data
US 2024/0162238 A1    May 16, 2024

(30) Foreign Application Priority Data
Nov. 10, 2022 (CN) .......................... 202211407267.3

(51) Int. Cl.
G02F 1/1362    (2006.01)
H10D 86/40    (2025.01)

(52) U.S. Cl.
CPC ..... *H10D 86/441* (2025.01); *G02F 1/136227* (2013.01); *G02F 2201/40* (2013.01)

(58) Field of Classification Search
CPC .. G02F 1/136227; G02F 1/1362; H10D 86/60
See application file for complete search history.

(56) References Cited

U.S. PATENT DOCUMENTS

2017/0317114 A1* 11/2017 Noh ...................... H10D 86/441
2021/0013238 A1*  1/2021 Suzuki .............. G02F 1/136227

* cited by examiner

*Primary Examiner* — Kevin M Nguyen
(74) *Attorney, Agent, or Firm* — PV IP PC; Wei Te Chung

(57) ABSTRACT

The display panel provided in the present application includes the substrate and the first conductive layer, the first insulating layer, the second conductive layer, the second insulating layer, the common electrode, and the connecting electrode disposed on the substrate in layers. The first insulating layer is provided with a first hole, the first hole exposes the first conductive layer, and the second conductive layer contacts the first conductive layer through the first hole. The second insulating layer is provided with a second hole, and the second hole exposes the second conductive layer. An orthographic projection of the second hole on the substrate overlaps with an orthographic projection of the first hole on the substrate.

19 Claims, 4 Drawing Sheets

DISPLAY PANEL

TECHNICAL FIELD

The present application relates to a field of display technologies, in particular, to a display panel.

BACKGROUND

Compared with current mainstream liquid crystal display panels with active layers of amorphous silicon, display panels with active layers of oxide semiconductor have technical advantages of higher electron mobility, higher switching current ratio, realizability of flexible display, good uniformity, and lower production cost, and have been widely favored by the industry.

A film layer structure of the display panel with the active layer of oxide semiconductor is relatively complex. The display panel generally includes two different inorganic film layers of silicon nitride and silicon oxide stacked with the active layer. It is very easy to cause undercut at the inorganic film layer during dry etching. Therefore, when a common electrode and a connecting electrode are formed, it is very easy to cause poor lap between the common electrode and the connecting electrode at the undercut structure. This will cause that a common voltage signal cannot be transmitted to the common electrode, resulting in poor display.

In order to avoid poor lap between the common electrode and the connecting electrode, the technical solution in prior art is to stagger a hole where the common electrode contacts the connecting electrode and a hole where the conductive layer contacts the connecting electrode, so as to reduce the risk of poor lap between the common electrode and the connecting electrode. However, this will compress an area of a light transmission area, and reduce an aperture ratio of the display panel.

Therefore, it is necessary to provide a display panel to relieve the above defect.

SUMMARY

A display panel is provided in embodiments of the present application. By merging a first hole where the first conductive layer contacts the second conductive layer with a second hole where the connecting electrode contacts the second conductive layer, an area occupied by the first hole and the second hole can be reduced, and an aperture ratio of the display panel can be improved.

A display panel is provided in embodiments of the present application, including:
- a substrate;
- a first conductive layer disposed on the substrate;
- a first insulating layer disposed at least on a surface of the first conductive layer away from the substrate, wherein the first insulating layer is provided with a first hole, the first hole exposes the first conductive layer;
- a second conductive layer disposed on a surface of the first insulating layer away from the substrate, wherein the second conductive layer contacts the first conductive layer through the first hole;
- a second insulating layer disposed at least on a surface of the second conductive layer away from the substrate, wherein the second insulating layer is provided with a second hole, an orthographic projection of the second hole on the substrate overlaps with an orthographic projection of the first hole on the substrate, and the second hole exposes the second conductive layer;
- a common electrode disposed in a surface of the second insulating layer away from the substrate;
- a connecting electrode disposed at least on a surface of the common electrode away from the substrate, wherein the connecting electrode contacts the common electrode, and the connecting electrode contacts the second conductive layer through the second hole; and
- a pixel electrode disposed in a same layer as the connecting electrode.

According to an embodiment of the present application, the orthographic projection of the second hole on the substrate falls within the orthographic projection of the first hole on the substrate.

According to an embodiment of the present application, the display panel further includes an organic insulating film layer, the organic insulating film layer is disposed at least between the second insulating layer and the common electrode;
the organic insulating film layer is provided with a third hole, an orthographic projection of the third hole on the substrate overlaps with the orthographic projection of the first hole on the substrate and the orthographic projection of the second hole on the substrate, and the third hole exposes the second conductive layer.

According to an embodiment of the present application, the orthographic projection of the third hole on the substrate falls within the orthographic projection of the first hole on the substrate.

According to an embodiment of the present application, a ratio of a diameter of a minimum circumscribed circle of a cross-section of the third hole to a diameter of a minimum circumscribed circle of a cross-section of the first hole is one of 1:1.1, 1:1.5, 1:2, and 1:3.

According to an embodiment of the present application, the orthographic projection of the second hole on the substrate falls within the orthographic projection of the third hole on the substrate.

According to an embodiment of the present application, the common electrode is provided with a fourth hole, the fourth hole exposes the second conductive layer;
an orthographic projection of the fourth hole on the substrate falls within the orthographic projection of the third hole on the substrate.

According to an embodiment of the present application, an edge of the second hole is flush with an edge of the fourth hole.

According to an embodiment of the present application, the display panel further includes a third insulating layer, the third insulating layer is disposed at least between the common electrode and the connecting electrode;
the third insulating layer is provided with a fifth hole, and the fifth hole exposes the common electrode and the second conductive layer.

According to an embodiment of the present application, the orthographic projection of the third hole on the substrate falls within an orthographic projection of the fifth hole on the substrate.

According to an embodiment of the present application, a difference between a diameter of a minimum circumscribed circle of a cross-section of the fifth hole and a diameter of a minimum circumscribed circle of a cross-section of the third hole ranges from 2.76 μm to 4.14 μm.

According to an embodiment of the present application, a diameter of a minimum circumscribed circle of a cross-section of the third hole is greater than or equal to a diameter of a minimum circumscribed circle of a cross-section of the first hole, and the diameter of the minimum circumscribed circle of the cross-section of the third hole is greater than a diameter of a minimum circumscribed circle of a cross-section of the fifth hole.

According to an embodiment of the present application, a ratio of the diameter of the minimum circumscribed circle of the cross-section of the third hole to the diameter of the minimum circumscribed circle of the cross-section of the first hole ranges from 1:1 to 3:1.

According to an embodiment of the present application, a thickness of the organic insulating film layer ranges from 1.2 μm to 1.8 μm.

According to an embodiment of the present application, an included angle between a sidewall of the third hole and a plane where the substrate is located ranges from 50° to 60°.

According to an embodiment of the present application, the display panel includes an active layer, a material of the active layer includes an oxide semiconductor material, the active layer is disposed between the first insulating layer and the second insulating layer;

the first insulating layer includes a first silicon nitride film layer and a first silicon oxide film layer, the first silicon nitride film layer is stacked with the first silicon oxide film layer, and the first silicon oxide film layer is located between the active layer and the first silicon nitride film layer;

the second insulating layer includes a second silicon nitride film layer and a second silicon dioxide film layer, the second silicon nitride film layer is stacked with the second silicon dioxide film layer, and the second silicon dioxide film layer is located between the active layer and the second silicon nitride film layer.

According to an embodiment of the present application, the display panel further includes a first metal layer including a plurality of patterned gate electrodes; the first conductive layer is disposed in a same layer as the gate electrodes.

According to an embodiment of the present application, the display panel further includes a second metal layer disposed on a surface of the first insulating layer away from the substrate;

the second metal layer includes a plurality of patterned source electrodes and drain electrodes, and the second conductive layer is disposed in a same layer as the source electrodes and the drain electrodes.

According to an embodiment of the present application, at the first hole, the second conductive layer is in full contact with the first hole exposes a surface of the first conductive layer.

Advantageous effects of the present application: the display panel provided in embodiments of the present application includes the substrate and the first conductive layer, the first insulating layer, the second conductive layer, the second insulating layer, the common electrode, and the connecting electrode disposed on the substrate in layers. The first insulating layer is provided with a first hole, the first hole exposes the first conductive layer, and the second conductive layer contacts the first conductive layer through the first hole. The second insulating layer is provided with a second hole, and the second hole exposes the second conductive layer. The orthographic projection of the second hole on the substrate overlaps with the orthographic projection of the first hole on the substrate, thereby reducing the area occupied by the first hole and the second hole, and increasing the aperture ratio of the display panel.

DETAILED DESCRIPTION OF EMBODIMENTS

Figure 1:
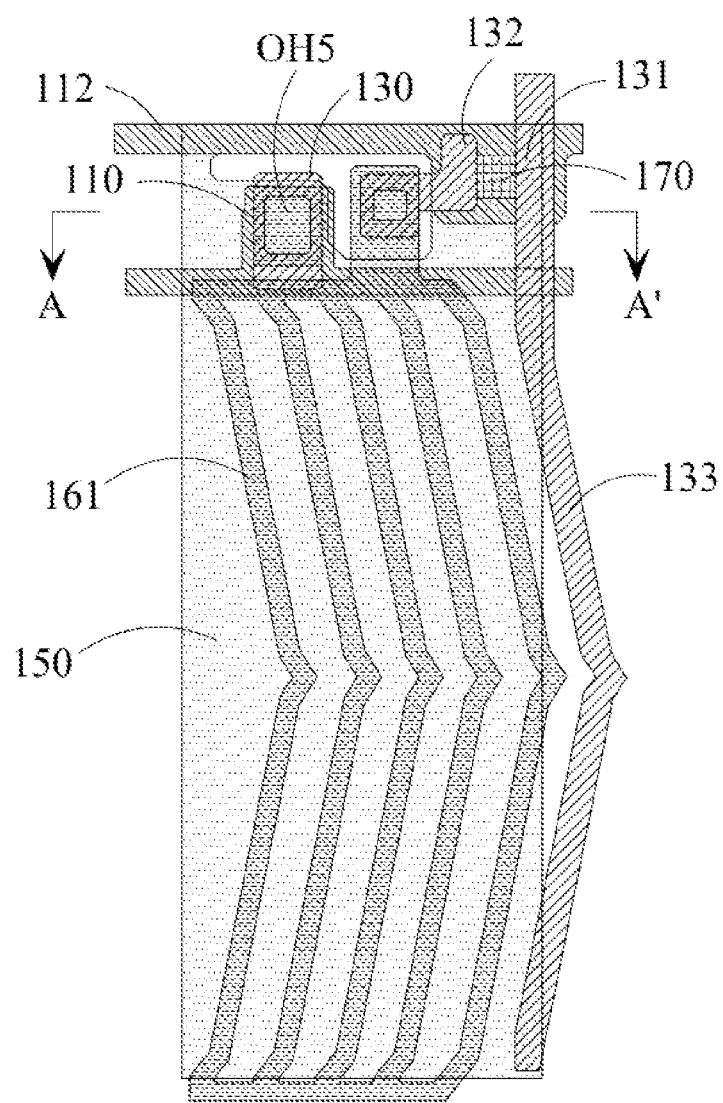
FIG. 1 is a schematic partial diagram of a display panel provided by embodiments of the present application.

The following descriptions of the various embodiments refer to the accompanying drawings to illustrate specific embodiments that the present application can be used to implement. The directional terms mentioned in the present application, such as "top", "bottom", "front", "back", "left", "right", "inside", "outside", "side", etc., are only directions to reference the additional schema. Therefore, the directional terms are used to illustrate and understand the present application, but not to limit the present application. In the figures, structurally similar elements are denoted by the same reference numerals.

The present application will be further described below in combination with the drawings and specific embodiments.

A display panel is provided in embodiments of the present application, which can reduce an area of a light-transmitting region occupied by a hole where the common electrode contacts the conductive layer and the connecting electrode, thereby increasing an aperture ratio of the display panel.

As shown in FIG. 1, FIG. 1 is a schematic partial diagram of a display panel provided by embodiments of the present application. The display panel may include a display area. A plurality of sub-pixels arranged in an array can be disposed in the display area. Every sub-pixel may have a sub-pixel electrode 161 and at least one thin-film transistor, and the thin-film transistor is electrically connected to the sub-pixel electrode 161.

Figure 2:
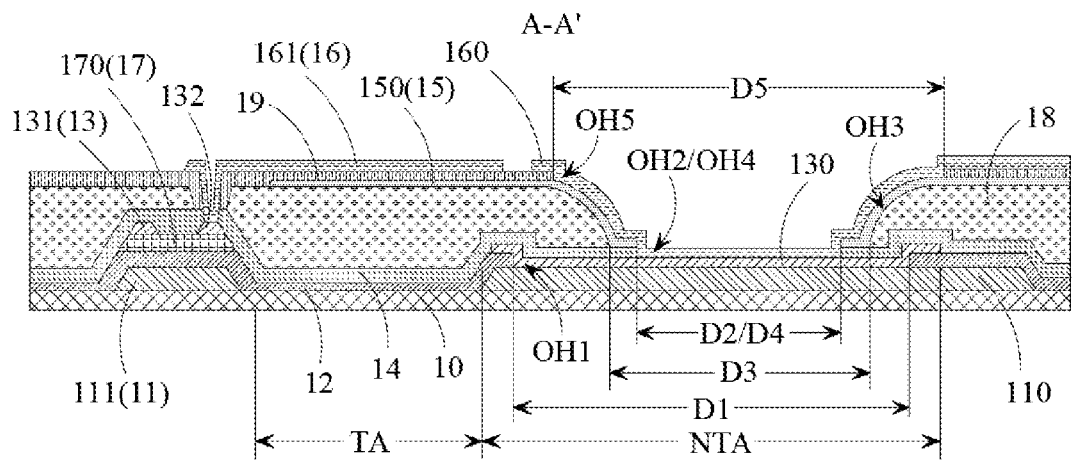
FIG. 2 is a schematic sectional diagram of a first embodiment of the display panel shown in FIG. 1 taken along A-A'.

As shown in FIG. 2, FIG. 2 is a schematic sectional diagram of a first embodiment of the display panel shown in FIG. 1 taken along A-A'. The display panel includes a substrate 10, a first conductive layer 110, a first insulating layer 12, a second conductive layer 130, a second insulating layer 14, a common electrode 150, and a connecting electrode 160.

The first conductive layer 110 is disposed on the substrate 10, the first insulating layer 12 is disposed at least on a surface of the first conductive layer 110 away from the substrate 10. The first insulating layer 12 is provided with a first hole OH1, and the first hole OH1 exposes the first conductive layer 110.

The second conductive layer 130 is disposed on a surface of the first insulating layer 12 away from the substrate 10. The second conductive layer 130 contacts the first conductive layer 110 through the first hole OH1.

The second insulating layer 14 is disposed at least on a surface of the second conductive layer 130 away from the substrate 10. The second insulating layer 14 is provided with a second hole OH2. An orthographic projection of the second hole OH2 on the substrate 10 overlaps with an orthographic projection of the first hole OH1 on the substrate 10. The second hole OH2 exposes the second conductive layer 130.

The common electrode 150 is disposed on a surface of the second insulating layer 14 away from the substrate 10. The connecting electrode 160 is disposed at least on a surface of the common electrode 150 away from the substrate 10. The connecting electrode 160 contacts the common electrode 150, and the connecting electrode 160 contacts the second conductive layer 130 through the second hole OH2. A common voltage signal in a signal line can be transmitted to the common electrode 150 via the first conductive layer 110, the second conductive layer 130, and the connecting electrode 160.

As shown in FIG. 1 and FIG. 2, an area corresponding to the first hole OH1 and the second hole OH2 is an opaque area NTA of the sub-pixel. An area corresponding to the sub-pixel electrode 161 is a light transmission area TA of the sub-pixel. Compared with the prior arts that the first hole OH1 and the second hole OH2 are staggered, the embodiments of the present application can reduce an area occupied by the first hole OH1 and the second hole OH2 by overlapping the orthographic projection of the first hole OH1 and the orthographic projection of the second hole OH2 on the substrate 10, thereby reducing an area of the non-light transmitting area NTA, and increasing an area of the light transmitting area TA, so as to improve the aperture ratio of the display panel. This can also shorten a length of a film formed on a side wall of the first hole OH1 and a side wall of the second hole OH2 when the connecting electrode 160 contacts the second conductive layer 130 and the common electrode 150 respectively, so as to reduce a risk of disconnection between the common electrode and the connecting electrode.

In the embodiments of the present application, the display panel may include a first metal layer 11, the first metal layer 11 may include a plurality of patterned gates electrodes 111 and a plurality of scan lines 112 extending laterally. The scan lines 112 are connected to the gate electrodes 111. The first conductive layer 110 may be disposed in a same layer as the gate electrodes 111, and a material of the first conductive layer 110 may be the same as that of the first conductive layer 110.

The first insulating layer 12 may also be a gate insulating layer. The first insulating layer 12 is disposed on the substrate 10, the first conductive layer 110, and the first metal layer 11. And the first insulating layer 12 may cover the gate electrodes 111. The first hole OH1 does not expose the first conductive layer 110.

The display panel may further include a second metal layer 13 disposed on a surface of the first insulating layer 12 away from the substrate 10. The second metal layer 13 may include a plurality of patterned source electrodes 131, drain electrodes 132, and a plurality of data lines 133 extending vertically. The second conductive layer 130 may be disposed in a same layer as the source electrodes 131 and the drain electrodes 132. And a material of the second conductive layer 130 may be the same as that of the source electrodes 131 and the drain electrodes 132.

The display panel may further include an active layer 17 disposed on a surface of the second insulating layer 14 away from the substrate 10. The active layer 17 includes a plurality of patterned semiconductor structures 170. The semiconductor structures 170 are disposed opposite to the gate electrode 111, and the source electrode 131 and the drain electrode 132 connect with the semiconductor structure 170 respectively.

In the embodiments of the present application, a material of the active layer 17 includes an oxide semiconductor material. The oxide semiconductor material may be but not limited to Indium Gallium Zinc Oxide (IGZO).

The second insulating layer 14 may also be a first passivation protective layer. The second insulating layer 14 is disposed on the first insulating layer 12. The second insulating layer 14 covers the second metal layer 13, the second conductive layer 130, and the active layer 17. The second hole OH2 goes through the second insulating layer 14 in a thickness direction of the display panel, and the second hole OH2 exposes the second conductive layer 130.

In an embodiment, the orthographic projection of the second hole OH2 on the substrate 10 falls within the orthographic projection of the first hole OH1 on the substrate 10.

As shown in FIG. 2, a diameter D1 of a minimum circumscribed circle of a cross-section of the first hole OH1 is greater than a diameter D2 of a minimum circumscribed circle of a cross-section of the second hole OH2. The orthographic projection of the second hole OH2 on the substrate 10 may fall within the orthographic projection of the first hole OH1 on the substrate 10. The connecting electrode 160 can directly contact a surface of the second conductive layer 130 away from the substrate 10 through the second hole OH2.

It should be noted that the cross-section of the first hole OH1, the cross-section of the second hole OH2, and cross-sections of the subsequent holes OH3 may be circular, or other shapes other than circular, such as ellipse, quadrilateral, etc. Taking the first hole OH1 as an example, when the first hole OH1 is a circular hole, the diameter D1 of the minimum circumscribed circle of the cross-section of the first hole OH1 is an aperture of the first hole OH1.

In the embodiments of the present application, the first insulating layer 12 includes a first silicon nitride film layer and a first silicon oxide film layer. The second insulating layer 14 includes a second silicon nitride film layer and a second silicon oxide film layer.

As shown in FIG. 2, the active layer 17 is disposed between the first insulating layer 12 and the second insulating layer 14. In the first insulating layer 12, the first silicon nitride film layer is stacked with the first silicon oxide film layer. The first silicon oxide film layer is located between the active layer 17 and the first silicon nitride film layer. The first silicon nitride film layer is separated from the active layer 17 by the first silicon oxide film layer, so as to reduce an impact of hydrogen in the first silicon nitride film layer on electrical properties of the active layer 17. The gate electrode 111 is separated from the active layer 17 by the first silicon nitride film layer, so as to reduce an impact of Cu ions in the gate electrode 111 on electrical properties of thin-film transistor devices.

In the second insulating layer 14, the second silicon nitride film layer is stacked with the second silicon oxide film layer, and the second silicon oxide film layer is located between the active layer and the second nitrogen oxide film layer. The second silicon nitride film layer is separated from the active layer 17 by the second silicon oxide film layer, so as to can reduce an influence of hydrogen element in the second silicon nitride film layer on the electrical properties of the active layer 17. The second silicon nitride film layer and the second silicon oxide film layer can also be used to block external water vapor.

It should be noted that, due to the first insulating layer 12 is a double-layer structure formed by stacking the first silicon nitride film layer and the first silicon oxide film layer, it is very easy to form an undercut structure at an edge of the first hole OH1 of the first insulating layer 12 during a dry etching process. The undercut structure may cause disconnection of the first conductive layer 110 and the second conductive layer 130 at the edge of the first hole OH1, resulting in poor connection. At the first hole OH1, the second conductive layer 130 is in full contact with a surface of the first conductive layer 110 exposed by the first hole OH1, which can reduce a risk of disconnection of the first conductive layer 110 and the second conductive layer 130 at the edge of the first hole OH1 due to the undercut structure at the edge of the first hole OH1.

In the embodiments of the present application, the display panel may include a first electrode layer 15, the first electrode layer 15 may be disposed on the surface of the second insulating layer 14 away from the substrate 10. The first electrode layer 15 may include a plurality of patterned common electrodes 150.

The display panel also includes an organic insulating film layer 18. The organic insulating film layer 18 is disposed at least between the second insulating layer 14 and the common electrode 150. The organic insulating film layer 18 can also cover an entire surface of the second insulating layer 14.

In an embodiment, a material of the organic insulating film layer 18 can be organic photoresist. The organic photoresist material has fluidity. After curing, a surface of the organic insulating film layer 18 away from the substrate 10 can be a flat surface, thus a flat terrain is formed.

As shown in FIG. 2, the organic insulating film layer 18 is provided with a third hole OH3. The third hole OH3 can go through the organic insulating film layer 18 in the thickness direction of the display panel. An orthographic projection of the third hole OH3 on the substrate 10 overlaps with the orthographic projection of the first hole OH1 and the orthographic projection of the second hole OH2 on the substrate 10, and the second conductive layer 130 can be exposed by the third hole OH3.

In an embodiment, the orthographic projection of the third hole OH3 on the substrate 10 falls within the orthographic projection of the first hole OH1 on the substrate 10.

As shown in FIG. 2, a diameter of the minimum circumscribed circle in a cross-section of the third hole OH3 is D3. The diameter of the minimum circumscribed circle in the cross-section of the third hole OH3 is less than the diameter of the minimum circumscribed circle in the cross-section of the first hole OH1 D1. The orthographic projection of the third hole OH3 on the substrate 10 may fall within the orthographic projection of the first hole OH1 on the substrate 10. A complex terrain between the first hole OH1 and the third hole OH3 is filled with the organic insulating film layer 18. This can avoid the complex terrain on a side wall of the third hole OH3 and between the third hole OH3 and the first hole OH1, so that the common electrode 150 and the connecting electrode 160 only need to climb along the organic insulating film layer 18 at the third hole OH3. Thereby, the risk of disconnection of the common electrode 150 and the connecting electrode 160 at the third hole OH3 due to the complex climbing terrain can be reduced.

Furthermore, a ratio of the diameter D3 of the minimum circumscribed circle in the cross-section of the third hole OH3 to the diameter D1 of the minimum circumscribed circle in the cross-section of the first hole OH1 ranges from 1:1 to 1:3. For example, the ratio of the diameter D3 of the minimum circumscribed circle in the cross-section of the third hole OH3 to the diameter D1 of the minimum circumscribed circle in the cross-section of the first hole OH1 may be 1:1.1, 1:1.5, 1:2, or 1:3.

In an embodiment, the orthographic projection of the second hole OH2 on the substrate 10 falls within the orthographic projection of the third hole OH3 on the substrate 10.

Figure 3:
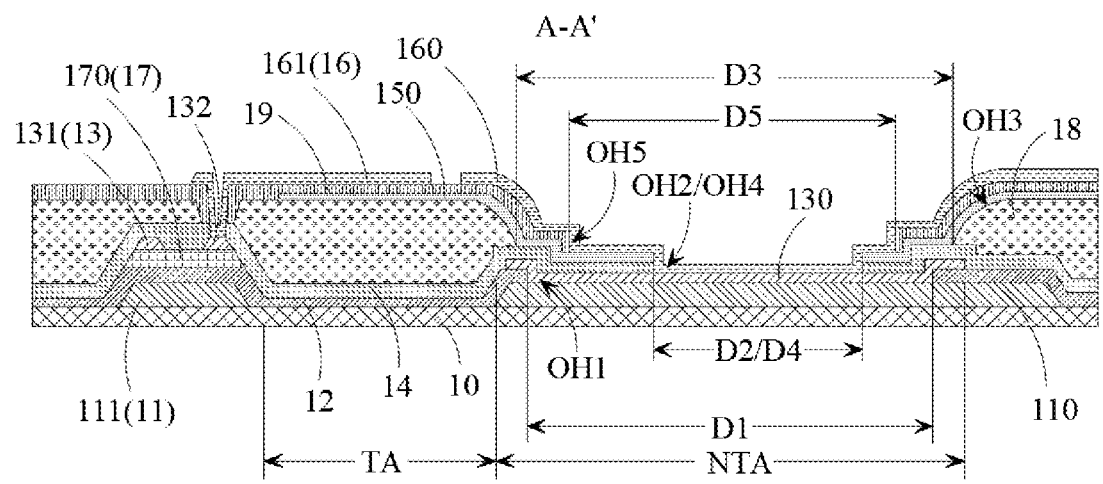
FIG. 3 is a schematic sectional diagram of a second embodiment of the display panel shown in FIG. 1 taken along A-A'.

As shown in FIG. 3, the diameter D2 of the minimum circumscribed circle in the cross-section of the second hole OH2 is less than the diameter D3 of the minimum circumscribed circle in the cross-section of the third hole OH3. The orthographic projection of the second hole OH2 on the substrate 10 may fall within the orthographic projection of the third hole OH3 on the substrate 10.

It should be noted that if the diameter D3 of the minimum circumscribed circle in the cross-section of the third hole OH3 is less than the diameter D2 of the minimum circumscribed circle in the cross-section of the second hole OH2, when the second insulating layer 14 is etched to form the second hole OH2, the organic insulating film layer 18 will be etched, resulting in more complex terrain at the second hole OH2 and the third hole OH3. The common electrode 150 and the connecting electrode 160 may break at the second hole OH2 and the third hole OH3. The complex terrain between the first hole OH1 and the second hole OH2 can be filled by the organic insulating film layer 18, which can reduce the risk of disconnection of the common electrode 150 and the connecting electrode 160.

Furthermore, the common electrode 150 is provided with a fourth hole OH4. The fourth hole OH4 exposes the second conductive layer 130.

As shown in FIG. 2, an orthographic projection of the fourth hole OH4 on the substrate 10 can overlap the orthographic projection of the third hole OH3 on the substrate 10. The fourth hole OH4 goes through the common electrode 150 in the thickness direction of the display panel, and the second conductive layer 130 can be exposed by the fourth hole OH4.

In an embodiment, the orthographic projection of the fourth hole OH4 on the substrate 10 falls within the orthographic projection of the third hole OH3 on the substrate 10

As shown in FIG. 2, a diameter D4 of a minimum circumscribed circle in a cross-section of the fourth hole OH4 is less than the diameter D3 of the minimum circumscribed circle in the cross-section of the third hole OH3. The orthographic projection of the fourth hole OH4 on the substrate 10 may fall within the orthographic projection of the third hole OH3 on the substrate 10. The common electrode 150 can extend along a side wall of the third hole OH3 to the second insulating layer 14 and exposed by the third hole OH3.

It should be noted that in preparation process, the fourth hole OH4 may be etched on the common electrode 150, and then the second insulating layer 14 may be etched using the common electrode 150 as a mask to define the second hole OH2. Therefore, the diameter D2 of the minimum circumscribed circle in the cross-section of the second hole OH2 is equal to the diameter D2 of the minimum circumscribed circle in the cross-section of the fourth hole OH4. An edge of the second hole OH2 can be flush with an edge of the fourth hole OH4. This can improve complexity of terrains at the second hole OH2 and the fourth hole OH4.

Furthermore, the connecting electrode 160 is disposed at least on a surface of the common electrode 150 away from the substrate 10. The connecting electrode 160 contacts the common electrode 150, and the connecting electrode 160 contacts the second conductive layer 130 through the second hole OH2.

As shown in FIG. 2, the display panel also includes a third insulating layer 19. The third insulating layer 19 is disposed at least between the common electrode 150 and the connecting electrode 160.

The third insulating layer 19 is provided with a fifth hole OH5. The orthographic projection of the third hole OH3 on the substrate 10 overlaps with an orthographic projection of the fifth hole OH5 on the substrate 10. The fifth hole OH5 exposes the common electrode 150 and the second conductive layer 130.

In an embodiment, the orthographic projection of the third hole OH3 on the substrate 10 falls within the orthographic projection of the fifth hole OH5 on the substrate 10.

As shown in FIG. 2, the diameter D3 of the minimum circumscribed circle in the cross-section of the third hole OH3 is less than a diameter D5 of a minimum circumscribed circle in a cross-section of the fifth hole OH5, so that the orthographic projection of the third hole OH3 on the substrate 10 falls within the orthographic projection of the fifth hole OH5 on the substrate 10. The fifth hole OH5 exposes the common electrode 150 and the second conductive layer 130. Therefore, a gradient difference of the connecting electrode 160 at the third hole OH3 can be reduced, and the connecting electrode 160 can be prevented from climbing along the third insulating layer 19 immediately after climbing along the common electrode 150 at the third hole OH3, thus reducing the risk of the connecting electrode 160 breaking at the third hole OH3 and the fifth hole OH5.

Furthermore, a thickness of the organic insulating film layer 18 ranges from 1.2 μm to 1.8 μm. An included angle between a side wall of the third hole OH3 and a plane wherein the substrate 10 is located ranges from 50° to 60°. A difference between the diameter D5 of the minimum circumscribed circle in the cross-section of the fifth hole OH5 and the diameter D3 of the minimum circumscribed circle in the cross-section of the third hole OH3 ranges from 2.76 μm to 4.14 μm. This can ensure a sufficient contact area between the common electrode 150 and the connecting electrode 160. And when the connecting electrode 160 is formed on the side wall of the third hole OH3, it will not form a film on a side wall of the fifth hole OH5, thus reducing the risk of disconnection of the connecting electrode 160.

In an embodiment, the display panel may include a second electrode layer 16. The second electrode layer 16 includes a plurality of patterned pixel electrodes 161. The connecting electrode 160 may be disposed in a same layer as the pixel electrode 161, and a material of the connecting electrode 160 can be the same as the pixel electrode 161.

As shown in FIG. 3, FIG. 3 is a schematic sectional diagram of a second embodiment of the display panel shown in FIG. 1 taken along A-A'. A structure of the display panel shown in FIG. 3 is roughly the same as that of the display panel shown in FIG. 2, and a difference is that the diameter D3 of the minimum circumscribed circle in the cross-section of the third hole OH3 is greater than or equal to the diameter D1 of the minimum circumscribed circle in the cross-section of the first hole OH1. The diameter D3 of the minimum circumscribed circle in the cross-section of the third hole OH3 is greater than the diameter D5 of the minimum circumscribed circle in the cross-section of the fifth hole OH5. Although the complex terrain between the second hole OH2 and the first hole OH1 can not be filled with the organic insulating film layer 18, a climbing path required for the connecting electrode 160 to contact the common electrode 150 and the second conductive layer 130 can still be shortened. Therefore, the risk of disconnection of the connecting electrode 160 and the common electrode 150 can be reduced.

In an embodiment, a ratio of the diameter D3 of the minimum circumscribed circle in the cross-section of the third hole OH3 to the diameter D1 of the minimum circumscribed circle in the cross-section of the first hole OH1 may range from 1:1 to 3:1. For example, the ratio of the diameter D3 of the minimum circumscribed circle in the cross-section of the third hole OH3 to the diameter D1 of the minimum circumscribed circle in the cross-section of the first hole OH1 is one of 1:1, 1:2, and 1:3.

In the embodiments of the present application, the display panel is a liquid crystal display panel. The display panel can also include a liquid crystal layer, an opposed substrate, and a backlight module (not shown in the figures). The opposed substrate can be disposed on a surface of the second electrode layer 16 away from the substrate. The liquid crystal layer can be disposed between the opposed substrate and the second electrode layer 16. The backlight module can be disposed on a surface of the substrate 10 away from the opposed substrate. The opposed substrate may be a traditional substrate including a color filter or a substrate without the color filter. Structures of the opposite substrate, the liquid crystal layer, and the backlight module can refer to structures of the opposite substrate, the liquid crystal layer, and the backlight module in the existing liquid crystal display panel, and there is no restriction here.

Figure 4A:
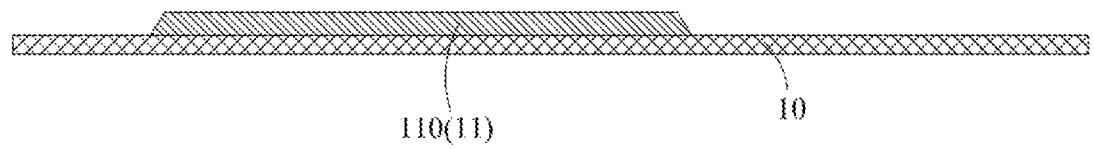
FIG. 4a to FIG. 4g are schematic flow diagrams of a manufacturing method of the display panel provided by the embodiments of the present application.

According to the display panel provided by the embodiments of the present application, the embodiments of the present application also provides a manufacturing method of the display panel. The manufacturing method of the display panel can be used to make the display panel provided by the above embodiments, as shown in FIG. 4a to FIG. 4g. FIG. 4a to FIG. 4g are schematic flow diagrams of a manufacturing method of the display panel provided by the embodiments of the present application. The manufacturing method of the display panel includes following steps:

Step S10: as shown in FIG. 4a, forming a first metal layer 11 on a substrate 10, and patterning the first metal layer 11 to form a first conductive layer 110.

Figure 4B:
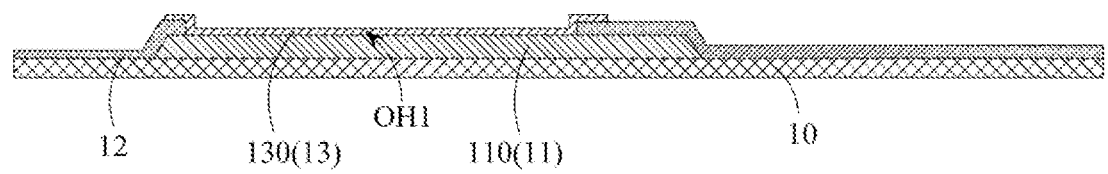

Step S20: as shown in FIG. 4b, forming a first insulating layer 12 on the substrate 10, etching the second insulating layer 14 to form a first hole OH1, and exposing the first conductive layer 110 by the first hole OH1.

Step S30: as shown in FIG. 4b, forming a second metal layer 13 on the first insulating layer 12, and patterning the second metal layer 13 to form a second conductive layer 130. The second conductive layer 130 contacts the first conductive layer 110 through the first hole OH1.

Figure 4C:
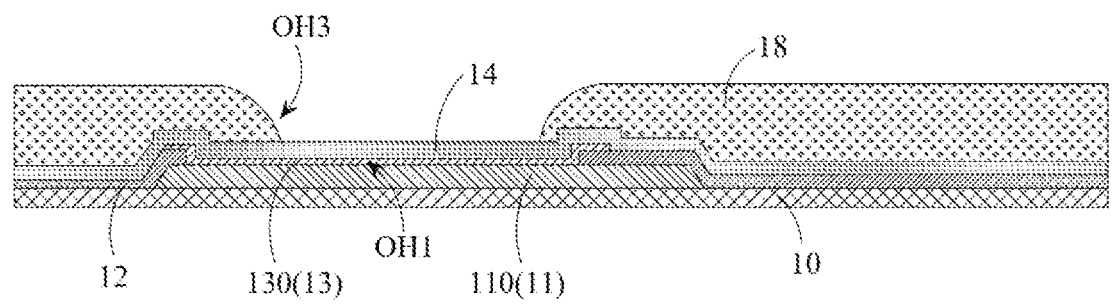

Step S40: as shown in FIG. 4c, forming a second insulating layer 14 on the second metal layer 13 and the first insulating layer 12, and forming an organic insulating film layer 18 on the second insulating layer 14.

Step S50: patterning the organic insulating film layer 18 to form a third hole OH3, and exposing the second insulating layer 14 by the third hole OH3.

Figure 4D:
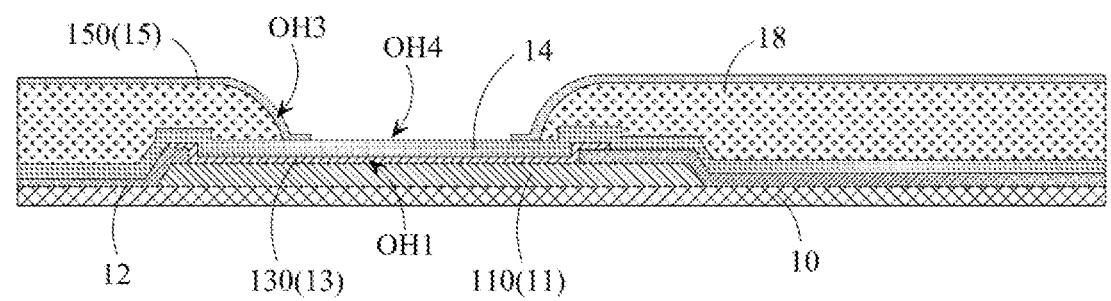

Step S60: As shown in FIG. 4d, forming a first electrode layer 15 on the organic insulating film layer 18 and the second insulating layer 14, patterning the first electrode layer 15 to form a common electrode 150 and a fourth hole OH4, and exposing the second insulating layer 14 by the fourth hole OH4.

Figure 4E:
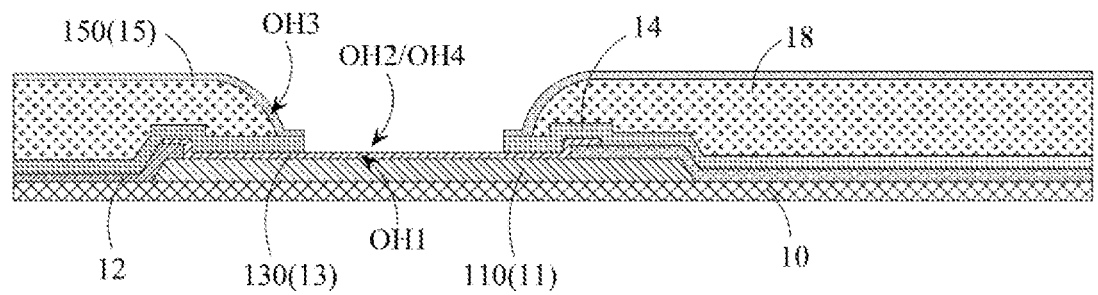

Step S60: as shown in FIG. 4e, etching the second insulating layer 14 to form a second hole OH2, and exposing the second conductive layer 130 by the second hole OH2.

Figure 4F:
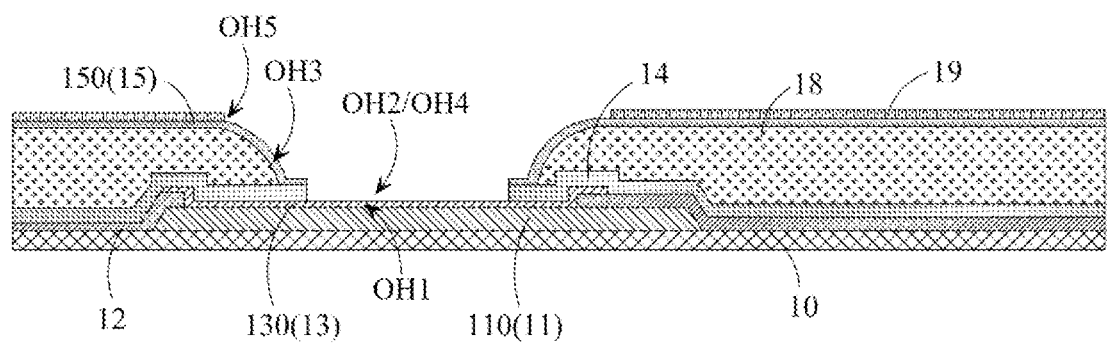

Step S70: As shown in FIG. 4f, forming a third insulating layer 19 on the second conductive layer 130 and the organic insulating film layer 18, etching the third insulating layer 19 to form a fifth hole OH5, and exposing the common electrode 150 and the second conductive layer 130 by the fifth hole OH5.

Figure 4G:
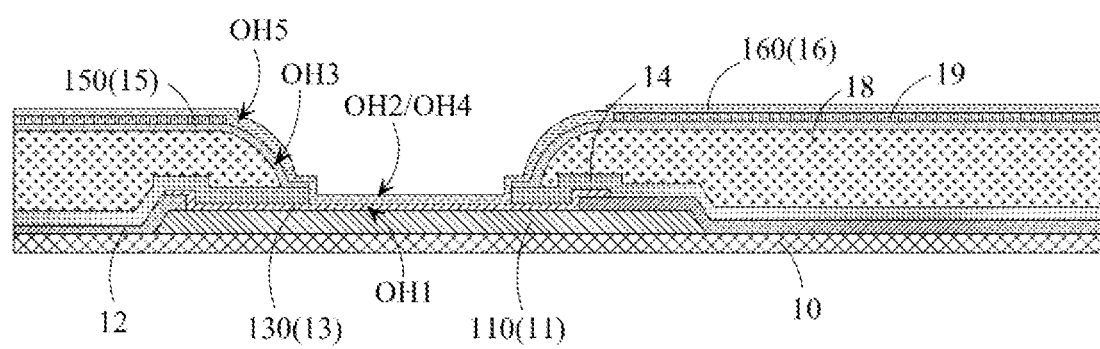

Step S80: As shown in FIG. 4g, forming a second electrode layer 16 on the third insulating layer 19, and patterning the second electrode layer 16 to form a connecting electrode 160. The connecting electrode 160 is in contact with the common electrode 150. The connecting electrode 160 is in contact with the second conductive layer 130 through the second hole OH2 and the fourth hole OH4.

Advantageous effects of the present application: the display panel provided in the present application includes the substrate and the first conductive layer, the first insulating layer, the second conductive layer, the second insulating layer, the common electrode, and the connecting electrode disposed on the substrate in layers. The first insulating layer is provided with a first hole, the first hole exposes the first conductive layer, and the second conductive layer contacts the first conductive layer through the first hole. The second insulating layer is provided with a second hole, and the second hole exposes the second conductive layer. The orthographic projection of the second hole on the substrate overlaps with the orthographic projection of the first hole on the substrate, thereby reducing the area occupied by the first hole and the second hole, and increasing the aperture ratio of the display panel.

In summary, although the present application discloses the above with preferred embodiments, the above preferred embodiments are not intended to limit the present application, and those of ordinary skill in the art can make various modifications without departing from the spirit and scope of the present application. Changes and modifications, so the protection scope of the present application is based on the scope defined by the claims.

What is claimed is:

1. A display panel, comprising:
a substrate;
a first conductive layer disposed on the substrate;
a first insulating layer disposed at least on a surface of the first conductive layer away from the substrate, wherein the first insulating layer is provided with a first hole, the first hole exposes the first conductive layer;
a second conductive layer disposed on a surface of the first insulating layer away from the substrate, wherein the second conductive layer contacts the first conductive layer through the first hole;
a second insulating layer disposed at least on a surface of the second conductive layer away from the substrate, wherein the second insulating layer is provided with a second hole, an orthographic projection of the second hole on the substrate overlaps with an orthographic projection of the first hole on the substrate, and the second hole exposes the second conductive layer;
a common electrode disposed on a surface of the second insulating layer away from the substrate;
a connecting electrode disposed at least on a surface of the common electrode away from the substrate, wherein the connecting electrode contacts the common electrode, and the connecting electrode contacts the second conductive layer through the second hole; and
a pixel electrode disposed in a same layer as the connecting electrode.

2. The display panel as claimed in claim 1, wherein the orthographic projection of the second hole on the substrate falls within the orthographic projection of the first hole on the substrate.

3. The display panel as claimed in claim 2, wherein the display panel further comprises an organic insulating film layer, the organic insulating film layer is disposed at least between the second insulating layer and the common electrode;
the organic insulating film layer is provided with a third hole, an orthographic projection of the third hole on the substrate overlaps with the orthographic projection of the first hole on the substrate and the orthographic projection of the second hole on the substrate, and the third hole exposes the second conductive layer.

4. The display panel as claimed in claim 3, wherein the orthographic projection of the third hole on the substrate falls within the orthographic projection of the first hole on the substrate.

5. The display panel as claimed in claim 4, wherein a ratio of a diameter of a minimum circumscribed circle of a cross-section of the third hole to a diameter of a minimum circumscribed circle of a cross-section of the first hole is one of 1:1.1, 1:1.5, 1:2, and 1:3.

6. The display panel as claimed in claim 4, wherein the orthographic projection of the second hole on the substrate falls within the orthographic projection of the third hole on the substrate.

7. The display panel as claimed in claim 3, wherein the common electrode is provided with a fourth hole, the fourth hole exposes the second conductive layer;
an orthographic projection of the fourth hole on the substrate falls within the orthographic projection of the third hole on the substrate.

8. The display panel as claimed in claim 7, wherein an edge of the second hole is flush with an edge of the fourth hole.

9. The display panel according to claim 7, wherein the display panel further comprises a third insulating layer, the third insulating layer is disposed at least between the common electrode and the connecting electrode;
the third insulating layer is provided with a fifth hole, and the fifth hole exposes the common electrode and the second conductive layer.

10. The display panel as claimed in claim 9, wherein the orthographic projection of the third hole on the substrate falls within an orthographic projection of the fifth hole on the substrate.

11. The display panel as claimed in claim 10, wherein a difference between a diameter of a minimum circumscribed circle of a cross-section of the fifth hole and a diameter of a minimum circumscribed circle of a cross-section of the third hole ranges from 2.76 μm to 4.14 μm.

12. The display panel as claimed in claim 9, wherein a diameter of a minimum circumscribed circle of a cross-section of the third hole is greater than or equal to a diameter of a minimum circumscribed circle of a cross-section of the first hole, and the diameter of the minimum circumscribed circle of the cross-section of the third hole is greater than a diameter of a minimum circumscribed circle of a cross-section of the fifth hole.

13. The display panel as claimed in claim 12, wherein a ratio of the diameter of the minimum circumscribed circle of the cross-section of the third hole to the diameter of the minimum circumscribed circle of the cross-section of the first hole ranges from 1:1 to 3:1.

14. The display panel as claimed in claim 3, wherein a thickness of the organic insulating film layer ranges from 1.2 μm to 1.8 μm.

15. The display panel as claimed in claim 3, wherein an included angle between a sidewall of the third hole and a plane where the substrate is located ranges from 50° to 60°.

16. The display panel as claimed in claim 1, wherein the display panel comprises an active layer, a material of the active layer comprises an oxide semiconductor material, the active layer is disposed between the first insulating layer and the second insulating layer;
the first insulating layer comprises a first silicon nitride film layer and a first silicon oxide film layer, the first silicon nitride film layer is stacked with the first silicon oxide film layer, and the first silicon oxide film layer is located between the active layer and the first silicon nitride film layer;

the second insulating layer comprises a second silicon nitride film layer and a second silicon dioxide film layer, the second silicon nitride film layer is stacked with the second silicon dioxide film layer, and the second silicon dioxide film layer is located between the active layer and the second silicon nitride film layer.

17. The display panel as claimed in claim 1, wherein the display panel further comprises a first metal layer comprising a plurality of patterned gate electrodes; the first conductive layer is disposed in a same layer as the gate electrodes.

18. The display panel as claimed in claim 1, wherein the display panel further comprises a second metal layer disposed on a surface of the first insulating layer away from the substrate;

the second metal layer comprises a plurality of patterned source electrodes and drain electrodes, and the second conductive layer is disposed in a same layer as the source electrodes and the drain electrodes.

19. The display panel as claimed in claim 1, wherein at the first hole, the second conductive layer is in full contact with the first hole exposes a surface of the first conductive layer.

* * * * *